(12) United States Patent
Kojima et al.

(10) Patent No.: US 6,650,578 B2
(45) Date of Patent: Nov. 18, 2003

(54) SEMICONDUCTOR STORAGE DEVICE AND SETTING METHOD THEREOF

(75) Inventors: Masatsugu Kojima, Yokohama (JP); Tomoharu Tanaka, Yokohama (JP); Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/229,147

(22) Filed: Aug. 28, 2002

(65) Prior Publication Data

US 2003/0043651 A1 Mar. 6, 2003

(30) Foreign Application Priority Data

Aug. 29, 2001 (JP) .......................................... 2001-259151

(51) Int. Cl.[7] ................................................. G11C 7/00
(52) U.S. Cl. ...................................... 365/200; 365/225.7
(58) Field of Search .............................. 365/200, 201, 365/225.7

(56) References Cited

U.S. PATENT DOCUMENTS

| | | | | |
|---|---|---|---|---|
| 4,047,163 A | * | 9/1977 | Choate et al. ................. 365/96 |
| 4,376,300 A | * | 3/1983 | Tsang ........................... 365/200 |
| 4,456,966 A | * | 6/1984 | Bringol et al. ................ 711/115 |
| 4,527,251 A | * | 7/1985 | Nibby et al. .................... 714/8 |
| 5,457,655 A | * | 10/1995 | Savignac et al. ............ 365/200 |
| 6,563,743 B2 | * | 5/2003 | Hanzawa et al. ....... 365/189.02 |

OTHER PUBLICATIONS

"64Mbit (8M × 8 bit) CMOS NAND E$^2$PROM" Toshiba MOS Digital Integrated Circuit Silicon Gate CMOS Data Sheet. (TC58V64FT) Nov. 9, 1998, 32 pages.

* cited by examiner

*Primary Examiner*—Son Mai
(74) *Attorney, Agent, or Firm*—Oblon, Spivak, McClelland, Maier & Neustadt, P.C.

(57) ABSTRACT

A semiconductor storage device includes a main memory cell array and a redundancy memory cell array. The redundancy memory cell array is set to selectively have a replacing area replacing a defective memory cell in the main memory cell array, and a non-replacing area other than the replacing area. Memory cells in the main memory cell array and the redundancy memory cell array are selected and driven by a memory selection circuit. A control section for controlling the memory selection circuit is set to assign main memory addresses to memory cells in the non-replacing area, and use these memory cells as an expansion area of the main memory cell array.

22 Claims, 8 Drawing Sheets

| Main memory address | Binary address | A0 | 1 | 0 | 0 | 0 | ... | 1 | 0 | 0 | | Redundancy memory cell | 1 | 0 | ... | 0 | 0 | ... | 0 |
|---|---|---|---|---|---|---|---|---|---|---|---|---|---|---|---|---|---|---|
| | | A1 | 0 | 1 | 0 | 0 | ... | 1 | 0 | 1 | | | 0 | 0 | ... | 0 | 0 | ... | 0 |
| | | A2 | 0 | 0 | 1 | 0 | ... | 0 | 1 | 1 | | | 0 | 1 | ... | 0 | 0 | ... | 0 |
| | | A3 | 0 | 0 | 0 | 1 | ... | 0 | 1 | 1 | | | 0 | 0 | ... | 1 | 0 | ... | 1 |
| | | A4 | 0 | 0 | 0 | 0 | ... | 1 | 0 | 0 | | | 1 | 1 | ... | 1 | 0 | ... | 1 |
| | Decimal address | | 1 | 2 | 3 | ... | 15 | 16 | 17 | | | | 17 | ... | 20 | ... | 24 |
| Redundancy memory address | Binary address | A0 | | | | | | | | | | 1 | 0 | ... | 0 | 0 | ... | 0 |
| | | A1 | | | | | | | | | | 0 | 0 | ... | 0 | 0 | ... | 0 |
| | | A2 | | | | | | | | | | 0 | 1 | ... | 1 | 0 | ... | 0 |
| | | A3 | | | | | | | | | | 0 | 0 | ... | 0 | 1 | ... | 1 |
| | | A4 | | | | | | | | | | 0 | 0 | ... | 0 | 0 | ... | 0 |
| | Decimal address | | | | | | | | | | | 1 | | | 4 | | | 8 |

SEMICONDUCTOR STORAGE DEVICE AND SETTING METHOD THEREOF

CROSS-REFERENCE TO RELATED APPLICATIONS

This application is based upon and claims the benefit of priority from the prior Japanese Patent Application No. 2001-259151, Aug. 29, 2001, the entire contents of which are incorporated herein by reference.

BACKGROUND OF THE INVENTION

1. Field of the Invention

The present invention relates to a semiconductor storage device including a main memory cell array and a redundancy memory cell array and a setting method thereof, and particularly to a technique for effectively using the redundancy memory cell array.

2. Description of the Related Art

A semiconductor storage device, such as a semiconductor storage device of a serial access type, is provided with a redundancy memory cell array as well as a main memory cell array, to improve the productivity. The main memory cell array and the redundancy memory cell array include a plurality of memory cells to perform writing, reading, and erasing of data. Where there is a defective memory cell in the main memory cell array, the defective memory cell is replaced with a memory cell in the redundancy memory cell array.

Figure 9:
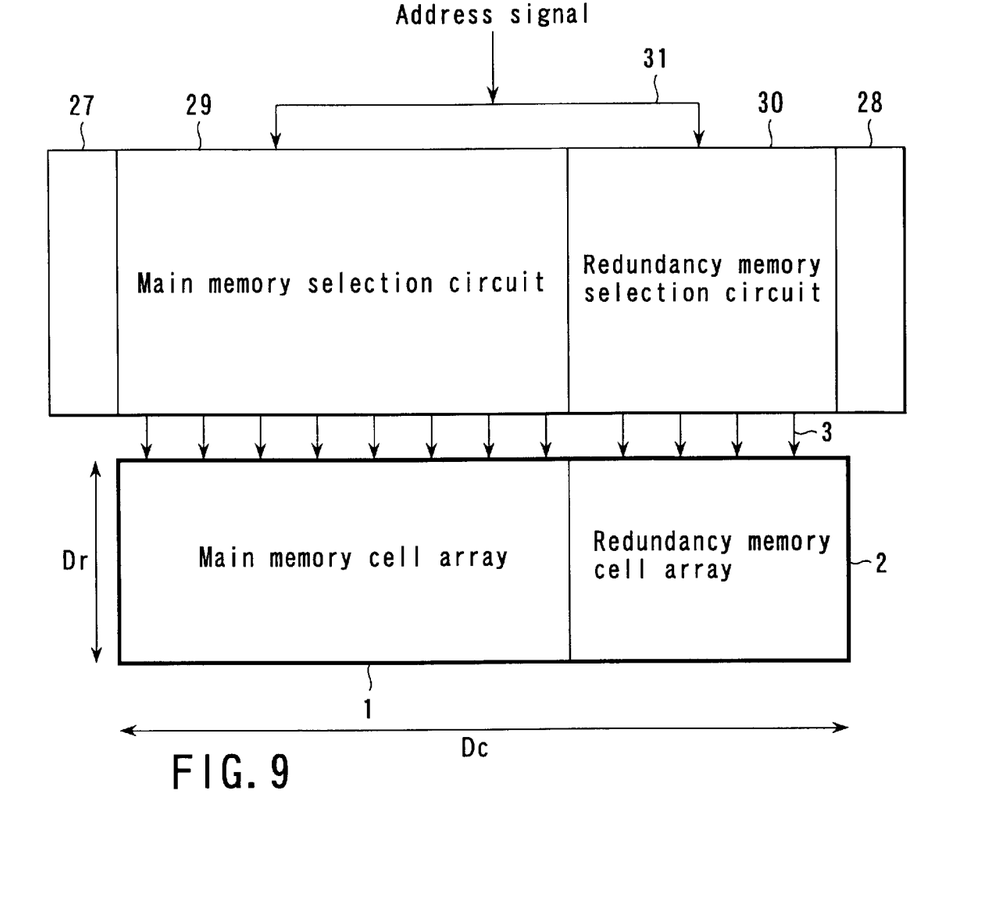
FIG. 9 is a block diagram showing a conventional semiconductor storage device.

FIG. 9 is a block diagram showing conventional partitioning of memory cell arrays and memory access routes. The memory cell arrays include a main memory cell array 1 and a redundancy memory cell array 2. Where a defective memory cell or a defective wiring line occurs in the main memory cell array 1, a memory cell in the redundancy memory cell array 2, which is an extra memory cell array prepared in advance, is set to be accessed, in place of the defective.

In FIG. 9, the vertical direction is the row direction Dr, and the horizontal direction is the column direction Dc. The number of memory cells in the row direction Dr and the column direction Dc is preset in light of the memory capacity. The columns of the main memory cell array 1 and the redundancy memory cell array 2 are respectively connected to selection signal lines 3. Those of the selection signal lines 3, which are connected to the columns of the main memory cell array 1, are connected to the main memory selection circuit 29. Those of the selection signal lines 3, which are connected to the columns of the redundancy memory cell array 2, are connected to the redundancy memory selection circuit 30. An address signal line 31 is connected to the main memory selection circuit 29 and the redundancy memory selection circuit 30.

A column isolation fuse group 27 is connected to the main memory selection circuit 29. A redundancy access fuse group 28 is connected to the redundancy memory selection circuit 30. Where there is a defective memory cell in the main memory cell array 1, a fuse corresponding thereto in the column isolation fuse group 27 is cut to avoid access to the defective memory cell. In addition, a fuse corresponding to a memory cell to be accessed is cut in the redundancy access fuse group 28. At this time a plurality of fuses are cut so that one redundancy column is automatically selected when the address of a defective column is selected. The combination of the cut fuses designates the address of the defective column to be replaced.

Figure 10:
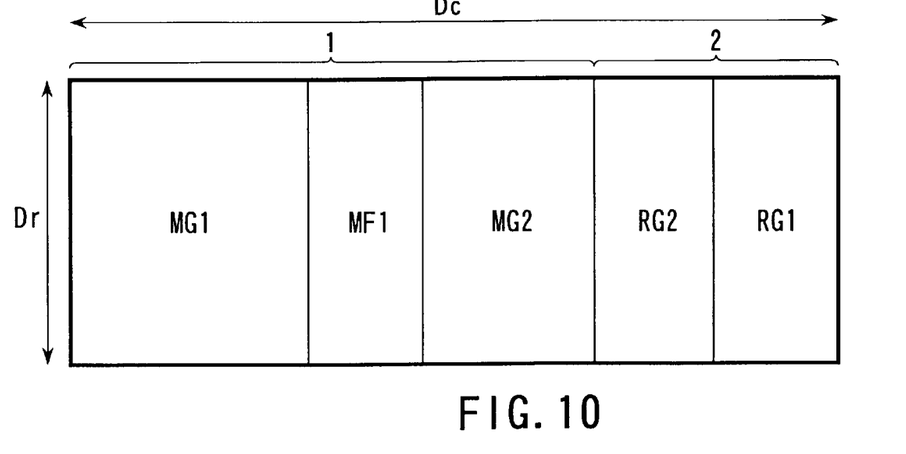
FIG. 10 is a block diagram showing memory cell arrays partitioned and prepared by cutting some fuses in the conventional semiconductor storage device.

FIG. 10 is a block diagram showing the memory cell arrays partitioned and prepared by cutting some fuses. The redundancy memory cell array 2 is used only for the purpose of providing memory cells to be accessed in place of defective memory cells in the main memory cell array 1. In FIG. 10, memory cell areas that can be accessed by main memory access commands are limited to normal memory cell areas MG1 and MG2 in the main memory cell array 1, and a replacing memory cell area RG1 in the redundancy memory cell array 2, which replaces a defective memory cell area MF1 in the main memory cell array 1.

Access to the redundancy memory cell array 2 requires a redundancy memory access command. In other words, in order to access an area RG2 in the redundancy memory cell array 2 shown in FIG. 10, other than the replacing memory cell area RG1, a special command has to be used.

When trimming a semiconductor storage device, it is necessary to test whether programming, erasing, and reading are properly performed, so as to determine defective memory cells. Specifically, a writing/reading operation and an erasing/reading operation are performed on the main memory cell array 1. If a defective memory cell, from which correct data is not read, is confirmed in the main memory cell array 1, a memory cell in the redundancy memory cell array 2 is assigned to a replacing memory cell candidate corresponding to the defective memory cell. Then, a writing/reading operation and an erasing/reading operation are performed on the replacing memory cell candidate. If correct data is read from this candidate, it is determined to use the candidate as the replacing memory cell.

If the correct data is not read from this candidate, another memory cell in the redundancy memory cell array 2 is reassigned to a replacing memory cell candidate. Then, as described above, a writing/reading operation and an erasing/reading operation are performed also on the reassigned candidate. If correct data is read from this reassigned candidate, it is determined to use the candidate as the replacing memory cell. If the correct data is not read from this reassigned candidate, another memory cell in the redundancy memory cell array 2 is further reassigned to a replacing memory cell candidate. This reassignment is repeatedly performed until a replacing candidate, from which the correct data is read, is found.

In the case of using main memory access commands and redundancy memory access commands, a defective memory cell is determined as follows. In this case, only the main memory cell array is accessible by inputting main memory access commands, while only the redundancy memory cell array is accessible by inputting redundancy memory access commands.

Specifically, a writing/reading operation and an erasing/reading operation are performed on the main memory cell array 1. If a defective area, from which correct data is not read, is confirmed in the main memory cell array 1, a specific area in the redundancy memory cell array 2 is assigned. Then, a writing/reading operation and an erasing/reading operation are performed on this specific area. If correct data is read from this specific area, it is determined to use the specific area as the replacing area. If correct data is not read from this specific area, a search for another area, from which correct data is read, is performed to use it as the replacing area.

Using either one of the two methods described above, a defective memory cell in the main memory cell array 1 is replaced with a normal memory cell in the redundancy memory cell array 2.

BRIEF SUMMARY OF THE INVENTION

According to a first aspect of the present invention, there is provided a semiconductor storage device comprising:

a main memory cell array including a plurality of memory cells;

a redundancy memory cell array including a plurality of memory cells, which are usable to replace a defective memory cell in the main memory cell array, the redundancy memory cell array being set to selectively have a replacing area replacing a defective memory cell in the main memory cell array, and a non-replacing area other than the replacing area;

a memory selection circuit configured to select and drive memory cells in the main memory cell array and the redundancy memory cell array;

a control section configured to control the memory selection circuit, the control section being set to assign main memory addresses to memory cells in the non-replacing area, and use these memory cells as an expansion area of the main memory cell array.

According to a second aspect of the present invention, there is provided a semiconductor storage device comprising:

a main memory cell array including a plurality of memory cells;

a redundancy memory cell array including a plurality of memory cells, which are usable to replace a defective memory cell in the main memory cell array;

a memory selection circuit configured to select and drive memory cells in the main memory cell array and the redundancy memory cell array, the memory selection circuit including a replacing circuit portion configured to replace a defective memory cell in the main memory cell array with a memory cell in the redundancy memory cell array, and the redundancy memory cell array being set by the replacing circuit portion to selectively have a replacing area replacing a defective memory cell in the main memory cell array, and a non-replacing area other than the replacing area;

an address increment circuit configured to supply the memory selection circuit with an address signal having address numbers gradually increased from a main memory address, so as to access memory cells in the non-replacing area, in succession to memory cells in the main memory cell array; and an end address control circuit configured to generate an end signal indicating that a selected specific address in the non-replacing area is an end address, wherein the address increment circuit stops operating upon the end signal being present.

According to a third aspect of the present invention, there is provided a method of setting a semiconductor storage device, comprising:

setting a redundancy memory cell array to selectively have a replacing area replacing a defective memory cell in a main memory cell array, and a non-replacing area other than the replacing area; and setting a control section to assign main memory addresses to memory cells in the non-replacing area, and use these memory cells as an expansion area of the main memory cell array, wherein the control section controls the memory selection circuit configured to select and drive memory cells in the main memory cell array and the redundancy memory cell array.

DETAILED DESCRIPTION OF THE INVENTION

In the process of developing the present invention, the inventors studied problems, in relation to the recent market demand, caused in a semiconductor storage device as described with reference to FIGS. 9 and 10. As a result, the present inventors have arrived at the finding given below.

There is a known technique of using error correction codes, so as to correct a certain number of errors, which are caused in a semiconductor storage device in operation. The larger the area for storing error correction codes, the more the error correction is possible. In other words, for higher data reliability, it is preferable to increase the area for storing error correction codes. Accordingly, in recent years, there is a case on a user side where part of the main memory cell array is used as the area for storing error correction codes.

Under the circumstances, it is occasionally necessary for manufacturers of semiconductor storage devices to increase the area for storing error correction codes, in response to requests from individual uses. Specifically, it is necessary to reduce the area of a redundancy memory cell array and to increase the area of a main memory cell array in semiconductor storage devices, in response to requests from individual uses. In this case, however, there is no choice but to redesign and remanufacture each semiconductor storage device in order to cope with the corresponding request. This entails an increase in the manufacturing cost and an increase in the manufacturing period.

In the case of a semiconductor storage device with a redundancy technique applied thereto, where the defective rate is low, the chip area including a redundancy memory cell array is unnecessarily increased that much. Accordingly, the number of semiconductor storage devices to be fabricated from one wafer is reduced, thereby lowering the productivity.

In other words, the redundancy memory cell array is left inefficiently used in such a semiconductor storage device with a low defective rate. This problem may be treated by reducing an unused part of the redundancy memory cell array and increasing the main memory cell array that much. In this case, however, there is no choice but to redesign and remanufacture each semiconductor storage device in order to cope with the corresponding case. This also entails an increase in the manufacturing cost and an increase in the manufacturing period.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

(First Embodiment)

Figure 2:
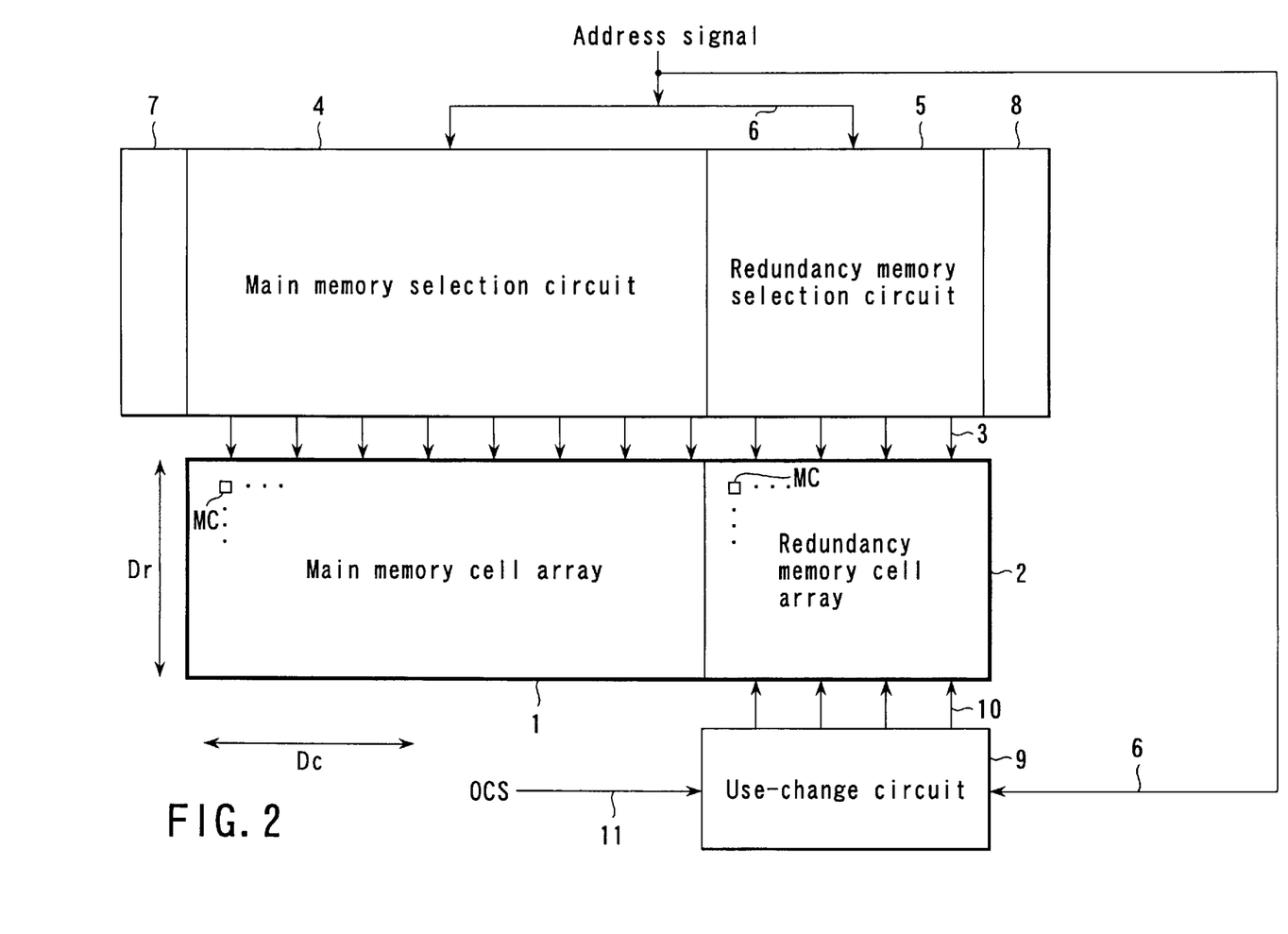
FIG. 2 is a block diagram showing a semiconductor storage device according to the first embodiment of the present invention.

FIG. 2 is a block diagram showing a semiconductor storage device according to a first embodiment of the present invention. The device has a main memory cell array 1 and a redundancy memory cell array 2, which include a plurality of memory cells MC to perform writing, reading, and erasing of data. Where there is a defective memory cell in the main memory cell array 1, the defective memory cell is replaced with a memory cell in the redundancy memory cell array 2.

In FIG. 2, the vertical direction is the row direction Dr, and the horizontal direction is the column direction Dc. The number of memory cells MC in the row direction Dr and the column direction Dc is preset in light of the memory capacity. The columns of the main memory cell array 1 and the redundancy memory cell array 2 are respectively connected to selection signal lines 3. Those of the selection signal lines 3, which are connected to the columns of the main memory cell array 1, are connected to the main memory selection circuit 4. Those of the selection signal lines 3, which are connected to the columns of the redundancy memory cell array 2, are connected to the redundancy memory selection circuit 5. An address signal line 6 is connected to the main memory selection circuit 4 and the redundancy memory selection circuit 5.

A column isolation fuse group 7 is connected to the main memory selection circuit 4. A redundancy access fuse group 8 is connected to the redundancy memory selection circuit 5. Where there is a defective memory cell in the main memory cell array 1, a fuse corresponding thereto in the column isolation fuse group 7 is cut to avoid access to the defective memory cell. In addition, a fuse corresponding to a memory cell to be accessed is cut in the redundancy access fuse group 8. At this time a plurality of fuses are cut so that one redundancy column is automatically selected when the address of a defective column is selected. The combination of the cut fuses designates the address of the defective column to be replaced.

Furthermore, a use-change circuit 9 for changing the use purposes of the redundancy memory cell array 2 is connected to the redundancy memory cell array 2 through signal lines 10. The output of the use-change circuit 9 is set by a control signal OCS from a signal line 11, and an address signal from an address signal line 6. The use-change circuit 9 switches the use purposes of the memory cells in the redundancy memory cell array 2 between a use as an expansion area of the main memory cell array 1 and a use as a replacing area for defective memory cells in the main memory cell array 1.

Since there is a system for enabling the redundancy memory cell array 2 to be used as an expansion area of the main memory cell array 1, the main memory cell array 1 can be easily expanded. In addition, when the semiconductor storage device is tested, it is possible to set the entire redundancy memory cell array 2 to be an expansion area of the main memory cell array, thereby accessing it with a main memory cell array programming command, a main memory cell array erasing command, and a main memory cell array reading command. In this case, all the memory cell arrays are accessible by the commands, and determination of defective memory cells can be easily performed for trimming.

Figure 3:
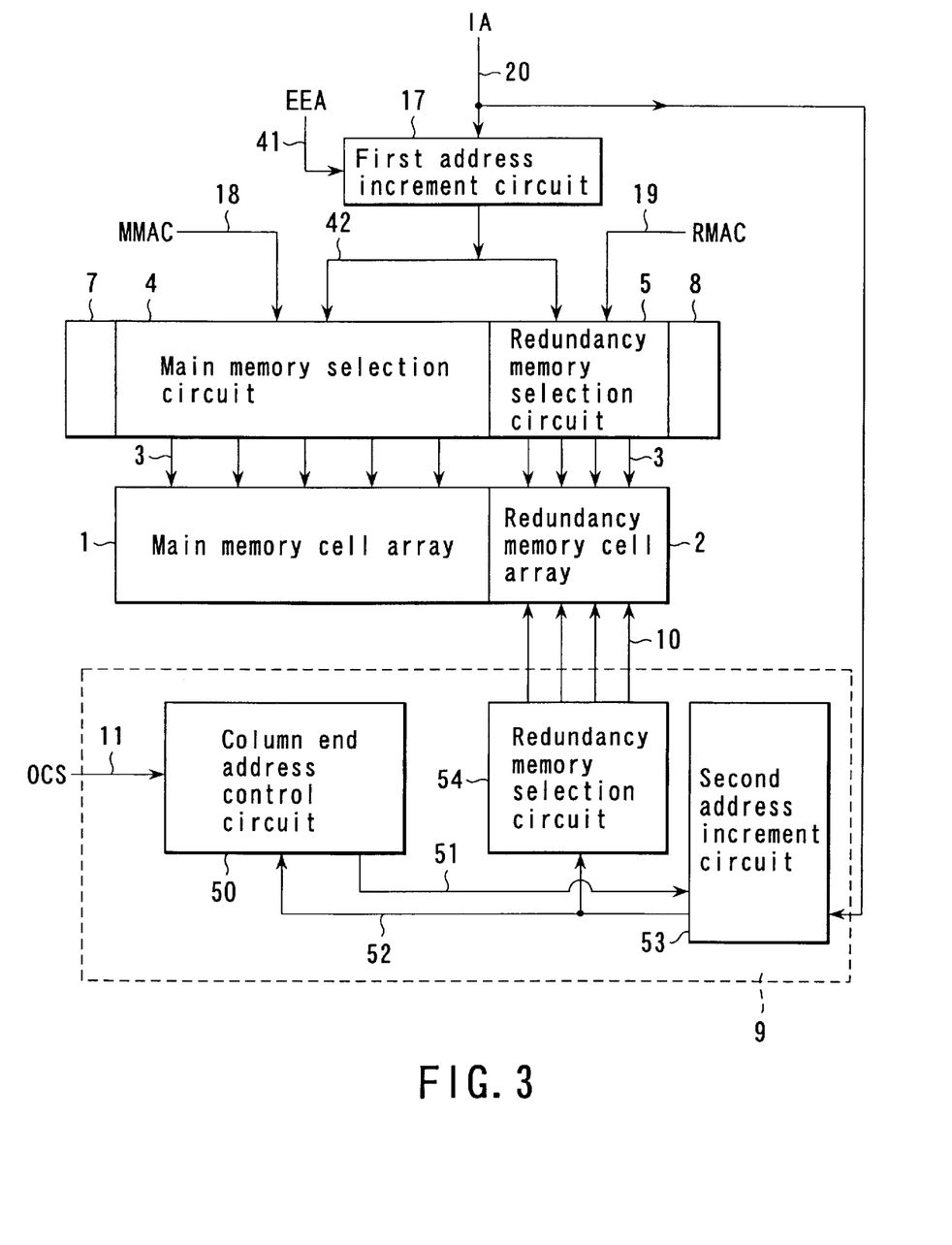
FIG. 3 is a block diagram showing the relationship of a use-change circuit relative to a main memory cell array, a redundancy memory cell array, and so forth in the semiconductor storage device shown in FIG. 2.

FIG. 3 is a block diagram showing the relationship of the use-change circuit 9 relative to the main memory cell array 1, the redundancy memory cell array 2, and so forth in the semiconductor storage device shown in FIG. 2.

A first address increment circuit 17 for increasing address numbers is connected to the main memory selection circuit 4 and the redundancy memory selection circuit 5 through a signal line 42. The first address increment circuit 17 is supplied with an input of a main memory cell array column end address EEA before expansion through a signal line 41, and an input address IA through an address input line 20. The output signal of the first address increment circuit 17 is inputted into the main memory selection circuit 4 and the redundancy memory selection circuit 5 through the signal line 42.

The main memory selection circuit 4 is supplied with an input of a main memory access command MMAC through a signal line 18. On the other hand, the redundancy memory selection circuit 5 is supplied with an input of a redundancy memory access command RMAC through a signal line 19.

The use-change circuit 9 includes a column end address control circuit 50, which is supplied with an input of a control signal OCS from the outside through the signal line 11. The output signal of the column end address control circuit 50 is inputted through a signal line 51 into a second address increment circuit 53 for increasing address numbers. The second address increment circuit 53 is also supplied with the input address IA through the address input line 20. The output signal of the second address increment circuit 53 is inputted into the column end address control circuit 50 through a signal line 52.

The output signal of the second address increment circuit 53 is also inputted through the signal line 52 into a redundancy memory selection circuit 54 disposed in the use-change circuit 9. The output signal of the redundancy memory selection circuit 54 is inputted into the redundancy memory cell array 2 through the signal lines 10.

Figure 1:
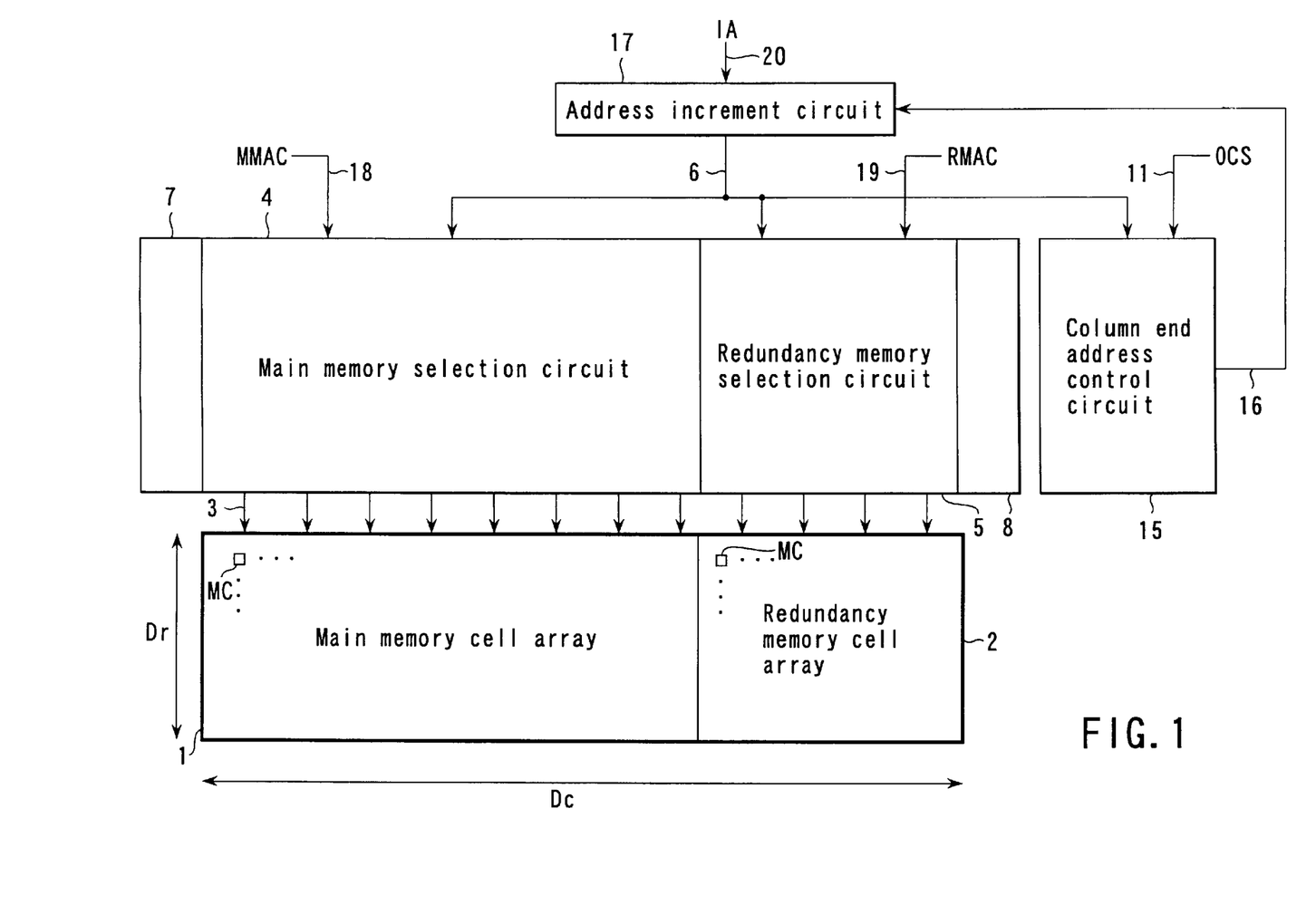
FIG. 1 is a block diagram showing a semiconductor storage device according to a modification of a first embodiment of the present invention.

In the arrangement shown in FIG. 3, there are some circuits overlapping each other, thereby increasing the circuit area. FIG. 1 is a block diagram showing a semiconductor storage device according to a modification of the first embodiment of the present invention. The arrangement shown in FIG. 1 can reduce the circuit area, as compared with the arrangement shown in FIG. 3. In FIG. 1, part of a redundancy memory selection circuit 5 and a column end address control circuit 15 correspond to the use-change circuit 9 shown in FIG. 2.

In the semiconductor storage device shown in FIG. 1, the column end address control circuit 15 is supplied with an input of an address signal through a signal line 6, and an input of a control signal OCS from the outside through a signal line 11. The column end address control circuit 15 outputs an address control signal, which is then inputted through a signal line 16 into an address increment circuit 17 for increasing address numbers.

The address increment circuit 17 is supplied with an input address IA through an address input line 20. The address increment circuit 17 outputs an address signal, which is then inputted through the address signal line 6 into the main memory selection circuit 4, the redundancy memory selection circuit 5, and the column end address control circuit 15. The main memory selection circuit 4 is supplied with an input of a main memory access command MMAC through a signal line 18. On the other hand, the redundancy memory selection circuit 5 is supplied with an input of a redundancy memory access command RMAC through a signal line 19.

The address signal from the address input line 20 is inputted into the main memory selection circuit 4 and the redundancy memory selection circuit 5 through the address increment circuit 17, whether the redundancy memory cell array 2 is accessed or not. At this time, the address increment circuit 17 sequentially increases the address numbers of the inputted address signal. As a result, the main memory selection circuit 4 and the redundancy memory selection circuit 5 are controlled to selectively access the main memory cell array 1 and the redundancy memory cell array 2 in a serial access form.

When the redundancy memory cell array 2 is not accessed, the address signal includes no main memory addresses assigned to the redundancy memory cell array 2. Consequently, no access to the redundancy memory cell array 2 is conducted. On the other hand, when the redundancy memory cell array 2 is accessed, the address signal includes main memory addresses assigned to the redundancy memory cell array 2. Consequently, access to the redundancy memory cell array 2 is conducted.

An explanation will be given of an exemplified storage device where the redundancy memory cell array 2 has 8 columns, and an area of 4 or 8 columns in the redundancy memory cell array 2 is used as an expansion area of the main memory cell array 1. The number of columns of the redundancy memory cell array 2 and the number of columns of the main memory cell array 1 are designed and preset in light of the memory capacity. One column area in the redundancy memory cell array 2 can replace one column defective area in the main memory cell array 1.

Figure 4:
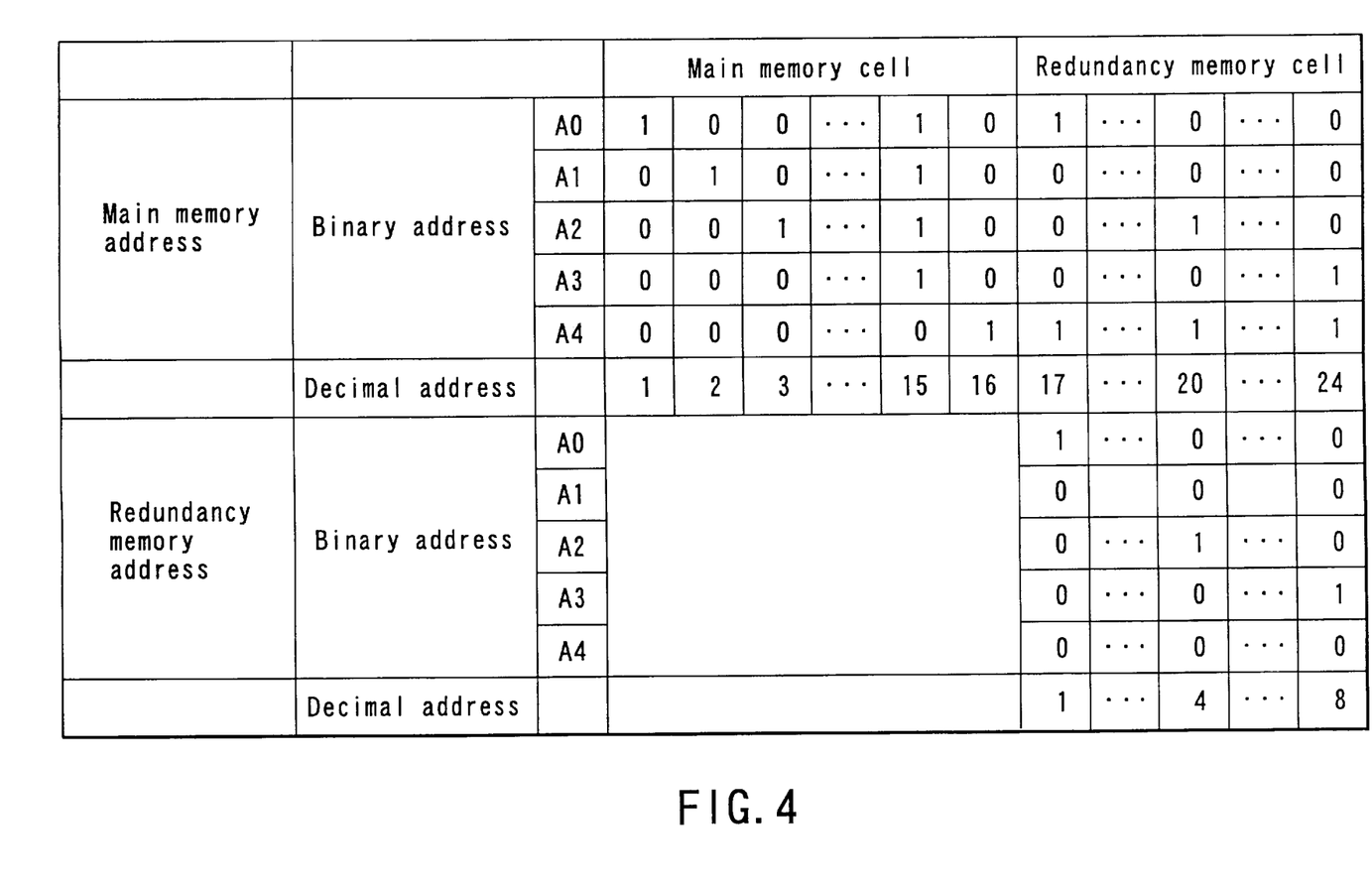
FIG. 4 is a view showing the relationship between main memory addresses and redundancy memory addresses in the semiconductor storage device shown in FIG. 1 or FIG. 2.

FIG. 4 is a view showing the relationship between main memory addresses and redundancy memory addresses in the semiconductor storage device shown in FIG. 1 or FIG. 2. In FIG. 4, of 536 columns arranged in practice, only 16 columns are shown with main memory addresses. Similarly, only 8 columns are shown with redundancy memory addresses.

In FIG. 4, address numbers expressed in the decimal system are increased one by one from 1 to 24. Where 4 columns in the redundancy memory cell array are used as an expansion area of the main memory cell array, decimal addresses of from 17 to 20 are assigned to them. Where 8 columns in the redundancy memory cell array are used as an expansion area of the main memory cell array, decimal addresses of from 17 to 24 are assigned to them. In practice, binary addresses are used in place of decimal addresses to select the main memory cell array and the redundancy memory cell array.

As described above, the redundancy memory cell array is provided with main memory addresses following addresses designating the main memory cell array. In this respect, conventionally, the addresses of a redundancy memory cell array are used only for replacing a defective memory area in a main memory cell array, and, when they are used, the addresses of defective memory cells in the memory cell array are assigned to them. In contrast, according to the present embodiment, in addition to the addresses of the main memory cell array, the own addresses of the redundancy memory cell array are set to follow the end address of the main memory cell array, as if the main memory cell array is expanded. Accordingly, the number of addresses used as the main memory cell array is increased as compared to conventional semiconductor storage devices.

As a matter of course, the redundancy memory cell array can be used as a replacing area, which is the original use purpose, for defective memory cells in the main memory cell array. In this case, memory cells in the redundancy memory cell array, which are other than memory cells used as the expansion area provided with addresses following the main memory cell addresses, are used as the replacing area to compensate for the defective memory cell.

Redundancy memory addresses are assigned only to the redundancy memory cell array. These addresses can be expressed by decimal addresses of from 1 to 8. In conventional semiconductor storage devices, a redundancy memory cell array is provided only with redundancy memory addresses.

Figure 5:
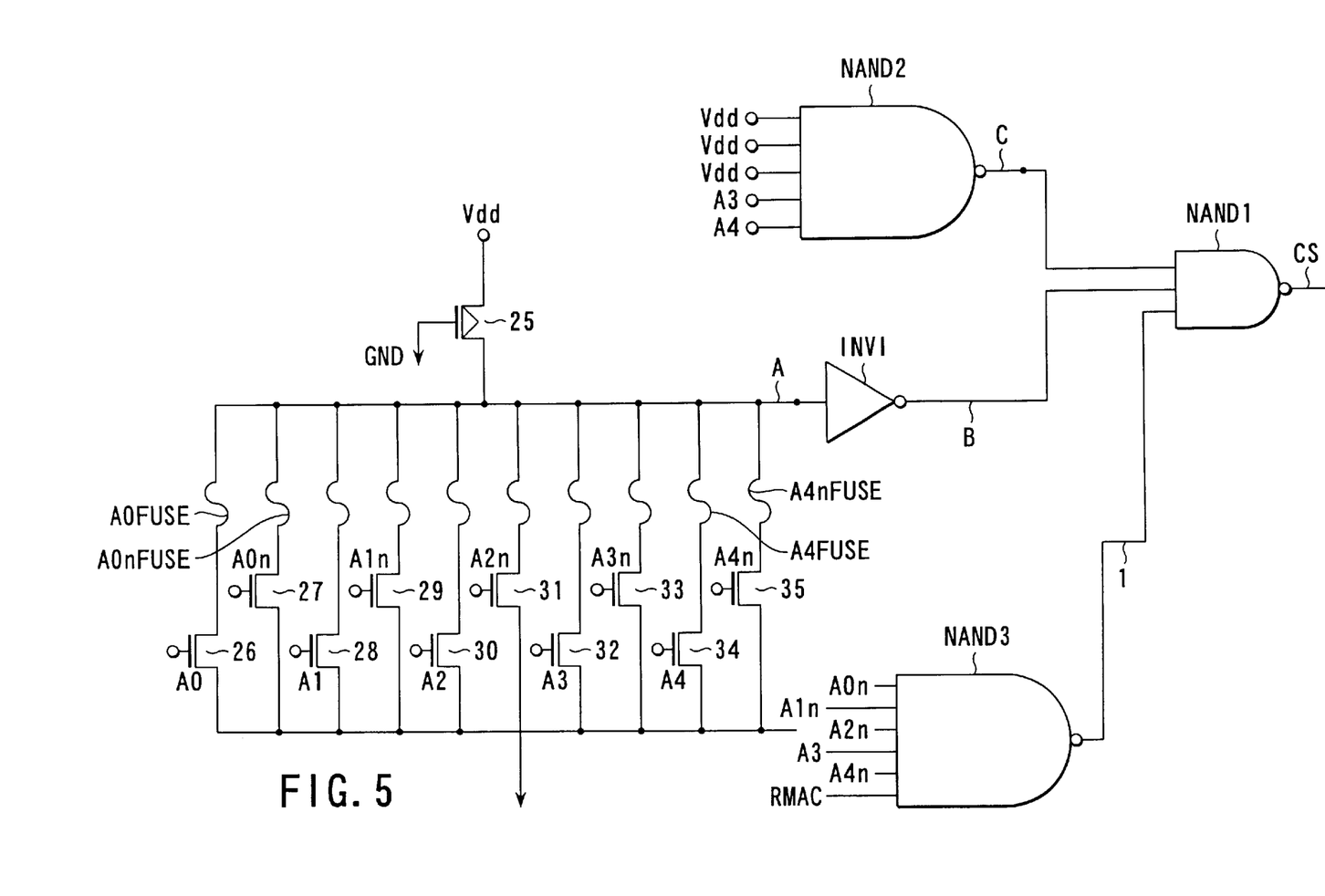
FIG. 5 is a partial circuit diagram showing access fuses and a redundancy memory selection circuit in the semiconductor storage device shown in FIG. 1.

FIG. 5 is a partial circuit diagram showing access fuses and the redundancy memory selection circuit in the semiconductor storage device shown in FIG. 1. As shown in FIG. 5, there is disposed a PMOS transistor 25 having a grounded gate, and a source connected to power supply potential Vdd. The drain of the PMOS transistor 25 is connected to one side ends of 10 fuses A0FUSE to A4FUSE and A0nFUSE to A4nFUSE, which are arrayed in this order to correspond to addresses A0 to A4 and their complementary addresses A0n to A4n. The other side ends of the fuses are respectively connected to the drains of 10 NMOS transistors 26 to 35, whose gates are supplied with inputs of addresses A0 to A4 and A0n to A4n. The sources of all the NMOS transistors 26 to 35 are grounded.

The drain of the PMOS transistor 25 is also connected to the input node A of a first inverter INV1. The output of the first inverter INV1 is inputted into the route B input terminal of a first NAND circuit NAND1 having three inputs. The route C input terminal of the first NAND circuit NAND1 having three inputs is connected to the output of a second NAND circuit NAND2 having five inputs, which are supplied with inputs of address signals A0 to A4. The second NAND circuit NAND2 is arranged such the output CS of the first NAND circuit NAND1 is set at H level (i.e., the column is selected) when the input address is 24 in decimal numbers. If an arrangement is adopted such that the node CS is set at H level when the input address is 17 in decimal numbers, it is necessary to input A0, A1n (the inverted signal of A1), A2n (the inverted signal of A2), A3n (the inverted signal of A3), and A4 into the second NAND circuit NAND2.

The route I input terminal of the first NAND circuit NAND1 having three inputs is supplied with the output of a third NAND circuit NAND3. The third NAND circuit NAND3 is supplied with inputs of addresses A0n, A1n, A2n, A3n, and A4n, and a redundancy memory access command RMAC.

The PMOS transistor 25, the fuses A0FUSE to A4FUSE and A0nFUSE to A4nFUSE, and the NMOS transistors 26 to 35 form a redundancy access fuse circuit. The first inverter INV1, the first NAND circuit NAND1, the second NAND circuit NAND2, and the third NAND circuit NAND3 form a redundancy memory selection circuit. The output CS of the first NAND circuit NAND1 is a signal for designating a specific address of the redundancy memory cell array.

The redundancy memory selection circuit is disposed as a part of the redundancy memory selection circuit 5 shown in FIG. 1. The redundancy access fuse circuit is disposed in the redundancy access fuse group 8 shown in FIG. 1.

The node CS shown in FIG. 5 is connected to one memory cell in the redundancy memory cell array 2. When the node CS is set at H level, the memory cell connected thereto is accessed. In this embodiment, three routes are prepared for setting the node CS at H level. First one of them is a route that is enabled when the address of a defective memory cell to be replaced is selected. Second one is a route that is enabled when an address used as an expansion area of the main memory cell array is selected. Third one is a route that is enabled when a specific address is selected in the case where a redundancy memory access command is inputted.

These routes are named route B, route C, and route I, respectively. In this embodiment, the route C is enabled when the main memory address is defined by A0 at L level, A1 at L level, A2 at L level, A3 at H level, and A4 at H level. When the route C is enabled, the node C is set at L level, and the node CS is set at H level.

Where a memory cell in the redundancy memory cell array is used to replace a defective memory cell, fuses A<i>FUSE (A<i> denotes A0, A1, A2, A3, or A4, hereinafter) and A<i>nFUSE are cut, so that the node A is set at H level when the address of a defective memory cell in the main memory cell array is selected. For example, where the address of a defective memory cell to be replaced is defined by A0 at H level, A1 at L level, A2 at H level, A3 at L level, and A4 at L level, fuses A0FUSE, A1nFUSE, A2FUSE, A3nFUSE, A4nFUSE are cut. Where no memory cells in the redundancy memory cell array are used to replace defective memory cells, no fuse A<i>FUSE and A<i>nFUSE are cut. Where none of these fuses are cut, the route B cannot be enabled.

In other words, where one column of the redundancy memory cell array is used as an expansion area of the main memory cell array, this portion of the redundancy memory cell array is set to be unused for replacing a defective memory cell. So long as the redundancy access fuses A<i>FUSE and A<i>nFUSE are not cut, the route B for replacing a defective memory cell is disabled. Accordingly, this portion of the redundancy memory cell array can be assigned to an expansion area of the main memory cell array.

On the other hand, where one column of the redundancy memory cell array is used as a replacing area for a defective memory cell, this portion of the redundancy memory cell array is set not to be enabled by serial access with main memory addresses. Namely, the route C is set to be disabled.

For example, where 4 columns of the redundancy memory cell array are used as an expansion area, 4 columns with smaller address numbers, i.e., Add17 to Add20, are assigned thereto. Accordingly, 4 columns with larger address numbers, i.e., Add21 to Add24, can be used as a replacing area for replacing defective memory cells. In this case, it is preset that only Add1 to Add20 can be inputted as read start addresses in serial access. In addition, the column end address is preset to be Add20 by the column end address control circuit, as described later. As a result, it is set in advance that the portion of redundancy memory cell array with addresses of Add21 or more can be accessed only from the route B.

Figure 6:
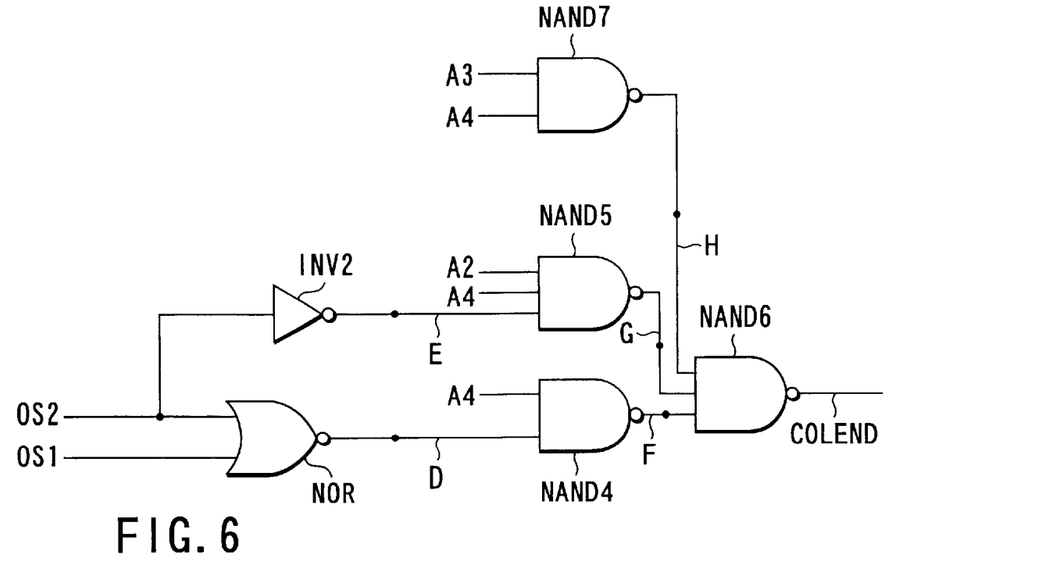
FIG. 6 is a circuit diagram showing a column end address control circuit in the semiconductor storage device shown in FIG. 1.

FIG. 6 is a circuit diagram showing the column end address control circuit in the semiconductor storage device shown in FIG. 1. As shown in FIG. 6, external signals OS1 and OS2 are inputted into the two input terminals of a NOR circuit NOR. The output of the NOR circuit NOR comes to a node D. The external signal OS2 is also inputted into a second inverter INV2. The output of the second inverter INV2 comes to a node E.

The output of the NOR circuit NOR comes to a node D, and is inputted into a fourth NAND circuit NAND4 along with an address signal A4. The output of the fourth NAND circuit NAND4 comes to a node F. The output of the second inverter circuit INV2 comes to a node E, and is inputted into a fifth NAND circuit NAND5 along with address signals A2 and A4. The output of the fifth NAND circuit NAND5 comes to a node G. Address signals A3 and A4 are inputted into a seventh NAND circuit NAND7. The output of the seventh NAND circuit NAND7 comes to a node H. The signals through the nodes F, G, and H are inputted into a sixth NAND circuit NAND6. The sixth NAND circuit NAND6 outputs an output signal COLEND.

The address increment circuit 17 shown in FIG. 1 increases column address numbers one by one. The address increment circuit 17 stops the column address increment when the output node COLEND of the sixth NAND circuit NAND6 is set at H level.

The column end address control circuit shown in FIG. 6 is not supplied with either input of the external signal OS1 and the external signal OS2 where the main memory cell array is not expanded. Where external signal OS1 is inputted, the main memory cell array is expanded by 4 columns. Where external signal OS2 is inputted, the main memory cell array is expanded by 8 columns. The output of the column end address control circuit is inputted into the address increment circuit 17. The address increment circuit 17 increases column address numbers one by one (serial access), and then, when the node COLEND is set at H level, it stops the column address number increment.

The external signals OS1 and OS2 are inputted when a latch circuit latches a command signal. The external signal OS1 is formed of, e.g., COLUMNMAX20, so that the column length is set to be 20 when this signal is inputted. The external signal OS2 is formed of, e.g., COLUMNMAX24, so that the column length is set to be 24 when this signal is inputted. In FIG. 4, the sum of the column lengths of the main memory cell array and the redundancy memory cell array is 24. Accordingly, when the external signal OS2 is inputted, the entire redundancy memory cell array is used as an expansion area of the main memory cell array.

The external signals OS1 and OS2 used as input signals in the column end address control circuit shown in FIG. 6 are at first inputted into a latch circuit (not shown) as command signals. The latch circuit latches the command signals as they are, when the command signals are inputted once. The column end address control circuit corresponds to the column end address control circuit 15 shown in FIG. 1.

An explanation will be given of circuit operations with reference to FIGS. 5 and 6.

Where the main memory cell array is not expanded, the following circuit operation is performed. Specifically, when the end of the column addresses of the main memory cell array is accessed, the node F in FIG. 6 is set at L level, and the node COLEND is set at H level. In this case, since no access is conducted to the redundancy memory cell array by an assigned main memory address, the route C in FIG. 5 is not set at H level. So long as the fuses A<i>FUSE and A<i>nFUSE are not cut, the redundancy memory cell array is not accessed.

Where the main memory cell array is expanded by 4 columns, the following circuit operation is performed.

Specifically, the external signal OS1 is inputted into the column end address control circuit shown in FIG. 6, and the node D is set at L level. Consequently, even after the end of the column addresses of the main memory cell array is accessed, the node F is kept at H level. As a result, column address increment is performed, so as to access the expansion area in the redundancy memory cell array, which has main memory addresses following the end of the column addresses of the main memory cell array.

In this example, the access is conducted first to a redundancy memory cell provided with a main memory address defined by A0 at H level, A1 at L level, A2 at L level, A3 at L level, and A4 at H level. When the column address increment advances to select the address defined by adding 4 to the end of the column addresses of the main memory cell array, the node G is set at L level, and the node COLEND is set at H level. As a result, in this example, the access ends at a redundancy memory cell provided with a main memory address defined by A0 at L level, A1 at L level, A2 at H level, A3 at L level, and A4 at H level.

Where the main memory cell array is expanded by 8 columns, the following circuit operation is performed. In this case, the entire redundancy memory cell array is used as an expansion area of the main memory cell array. Specifically, the external signal OS2 is inputted into the column end address control circuit shown in FIG. 6, and the nodes D and E are set at L level. Consequently, even after the end of the column addresses of the main memory cell array is accessed, the nodes F and G are kept at H level. As a result, column address increment is performed, so as to access the expansion area in the redundancy memory cell array, which has main memory addresses following the end of the column addresses of the main memory cell array.

Even when the column address increment advances to select the address defined by adding 4 to the end of the column addresses of the main memory cell array, the node G is kept at H level. Consequently, column address increment is further performed, so as to further access the expansion area in the redundancy memory cell array.

When the column address increment advances to select the address defined by adding 8 to the end of the column addresses of the main memory cell array, the node H is set at L level, and the node COLEND is set at H level. As a result, in this example, the access ends at a redundancy memory cell provided with a main memory address defined by A0 at L level, A1 at L level, A2 at L level, A3 at H level, and A4 at H level.

In other words, where the redundancy memory cell array is used as an expansion area of the main memory cell array, the column end address is preset to be larger. Where a plurality of routes are prepared for setting the control signal COLEND at H level in the column end address control circuit, the column end address can be changed stepwise. The redundancy memory cell array is provided with addresses following the main memory cell array. When a read start address is designated, serial access is performed such that accessed address numbers are increased one by one therefrom, until the address of a column agrees with the column end address. With this arrangement, the use purposes of the redundancy memory cell array 2 can be switched on the basis of an external input signal, by the address increment circuit 17, the column end address control circuit 15, the redundancy memory selection circuit 5, and so forth.

The column end address is set at Add20 or Add24, so that 4 or 8 columns of the redundancy memory cell array are used as an expansion area of the main memory cell array. This address is defined by adding 4 or 8 to the end address Add16 of the main memory cell array before expansion.

Where 4 columns of the redundancy memory cell array are used as an expansion area of the main memory cell array, the column end address is set at Add20. The read start address is set at Add1. From this address, serial access is performed such that accessed address numbers are increased one by one. By doing so, addresses are accessed in the order of Add1, Add2, Add3, . . . . When an address Add3 is accessed, the memory cell of the 3rd column is accessed. When the serial access further advances to select an address Add16, the memory cell of the 16th column is accessed.

Where there are no expanded columns, the column end address is set to be Add16, so that memory cells only of 16 columns are accessed without accessing addresses after Add16. Where the column end address is changed to Add20, the serial access further advances without a break. The addresses after Add17 are assigned to memory cells of the redundancy memory cell array. Using an address Add20, memory cells of 20 columns are accessed. Where memory cells of 8 columns of the redundancy memory cell array are used as an expansion area of the main memory cell array, the column end address is set to be Add24.

The number of columns used as an expansion area is arbitrarily changeable. For example, there may be adopted a structure, which allows nine ways of setting the column end address. In this case, nine routes are prepared for setting the control signal COLEND at H level in a column end address control circuit, so that the size of an expansion area of the main memory cell array can be changed stepwise. In this embodiment, although the column length is expanded to expand the main memory cell array, the row length may be expanded to expand the main memory cell array.

In an aspect according to this embodiment, the following method of manufacturing a semiconductor storage device may be adopted. Specifically, as in general, a semiconductor storage device having a main memory cell array, a redundancy memory cell array, and a peripheral circuit is formed by steps of implanting impurity ions, forming gates, forming wiring lines, and so forth. Then, a test is performed to examine whether there is a defective memory cell in the main memory cell array. Where there is a defective memory cell, a specific address is assigned not to the main memory cell array to be serially accessed, but to the redundancy memory cell array.

Then, specific addresses in the redundancy memory cell array other than the defective memory replacing area are set to be selectively usable as an area of the main memory cell array for storing error correction codes (error correction code area). According to this method of manufacturing a semiconductor storage device, the error correction code area can be formed in the redundancy memory cell array by a small number of steps.

In another aspect according to this embodiment, there is provided a semiconductor storage device comprising a main memory cell array 1 for performing writing, reading, and erasing of data; a redundancy memory cell array 2 for performing writing, reading, and erasing of data, in place of part of the main memory cell array 1; a memory selection circuit 4 and 5 for controlling, based on a control signal inputted thereto, writing, reading, and erasing of data in the main memory cell array 1 and the redundancy memory cell array 2; and a column end address control circuit 15 for outputting, to the memory selection circuit 4 and 5, a control signal indicating that a selected specific address is a column end address.

In another aspect according to this embodiment, there is provided a semiconductor storage device comprising a main memory cell array 1 for performing writing, reading, and erasing of data; a redundancy memory cell array 2 for performing writing, reading, and erasing of data, in place of part of the main memory cell array 1; a main memory selection circuit 4 for controlling, based on an address signal inputted thereto, writing, reading, and erasing of data in the main memory cell array 1; a redundancy memory selection circuit 5 for controlling, based on an address signal and a redundancy memory access command inputted thereto, writing, reading, and erasing of data in the redundancy memory cell array 2; and a column end address control circuit 15 for outputting, to the redundancy memory selection circuit 5, a control signal indicating that a selected specific address is a column end address.

A device according to this embodiment may comprise an address increment circuit 17. The address increment circuit 17 receives the output of the column end address control circuit 15, gradually increases the address signal, and outputs it to the redundancy memory cell array 5. The address increment circuit 17 stops gradually increasing the address when the output of the column end address control circuit 15 is a control signal indicating a column end address.

In a device according to this embodiment, the specific address may be treated as an address signal denoting an error correction code area. An error correction code area may be disposed in each of the main memory cell array 1 and the redundancy memory cell array 2. The column end address control circuit may include a fuse to be cut so as to specify and output a control signal indicating a column end address. The redundancy memory selection circuit 5 may be arranged such that it receives an input of a certain address signal, and assigns a specific area of the redundancy memory cell array to an error correction code area.

In a device according to this embodiment, the redundancy memory selection circuit 5 may be arranged such that it includes fuses corresponding to address signals, of which a fuse corresponding to an address signal instructing replacement of a defective memory cell is cut. The redundancy memory selection circuit 5 may be arranged such that it includes fuses corresponding to address signals, of which a fuse corresponding to an address signal assigned to an error correction code area is kept uncut. A control signal indicating a column end address may be specified by an external input signal. The entire area of the redundancy memory cell array 2 may be assigned to an error correction code area.

In another aspect according to this embodiment, there is provided a method of using a semiconductor storage device, which comprises assigning specific addresses of a main memory cell array 1 serially accessed to an error correction code area; assigning a specific address of a redundancy memory cell array 2 to an error correction code area; and designating one of the specific addresses, and performing writing, reading, and erasing of data in an area corresponding to this specific address in the main memory cell array or the redundancy memory cell array.

In this method of using a semiconductor storage device, when assigning a specific address of the redundancy memory cell array 2 to an error correction code area, all the addresses of the redundancy memory cell array 2 may be assigned to the error correction code area.

In another aspect according to this embodiment, there is provided a method of using a semiconductor storage device, which comprises serially accessing part of a main memory cell array 1 to which specific addresses are assigned; and serially accessing part of a redundancy memory cell array 2 to which addresses are assigned to follow the addresses assigned to the main memory cell array 1.

In this embodiment, at least one column of the redundancy memory cell array may be used as an expansion area of the main memory cell array. Accordingly, it is possible for a user to set a larger error correction code area for correcting errors caused in the semiconductor storage device in operation. In this case, an error correction code area is formed not only in part of the main memory cell array, but also in the redundancy memory cell array. In other words, the redundancy memory cell array can be used as an error correction code area. As a result, reliability of data increases, while satisfying user's demands of different levels by one semiconductor storage device.

For example, a user can partition the main memory cell array of the semiconductor storage device into a free writing area and an error correction code area. In this case, the user can increase the error correction code area to improve reliability of data while maintaining the capacity of the free writing area for the semiconductor storage device in operation.

(Second Embodiment)

In this embodiment, a column end address control circuit includes a metal fusion fuse or a ROM fuse for storing data that determines a column end address (i.e., that determines the size of an expansion area of a main memory cell array in a redundancy memory cell).

Figure 7:
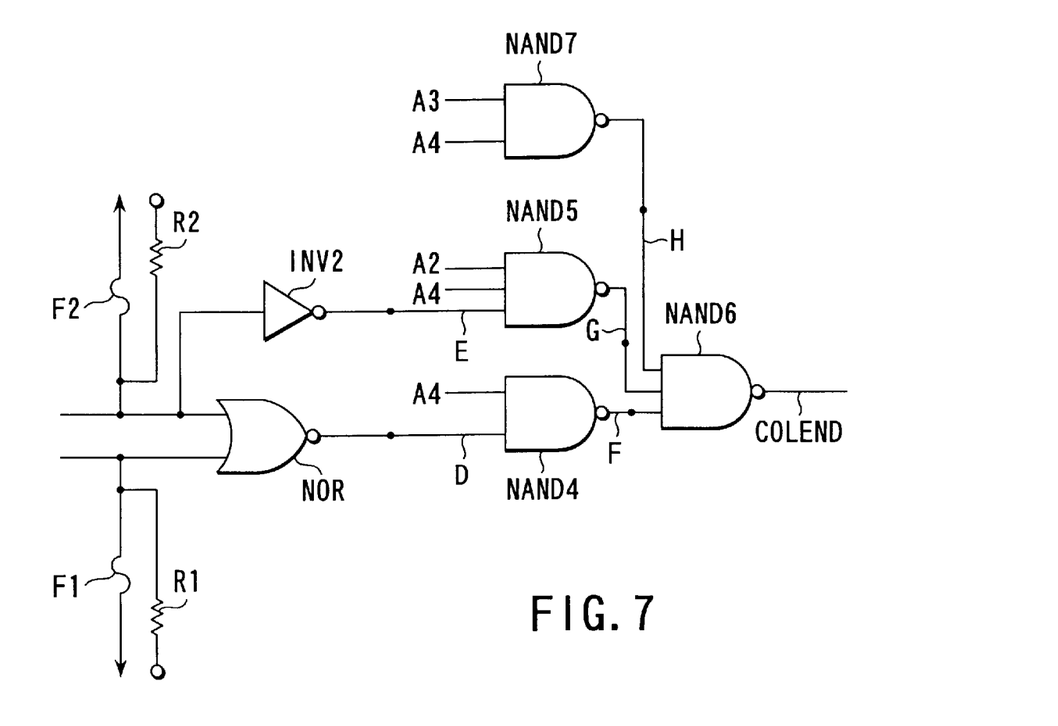
FIG. 7 is a circuit diagram showing a column end address control circuit in a semiconductor storage device according to a second embodiment of the present invention.

FIG. 7 is a circuit diagram showing a column end address control circuit in a semiconductor storage device according to a second embodiment of the present invention. The column end address control circuit shown in FIG. 7 is used as the column end address control circuit 15 shown in FIG. 1.

In the column end address control circuit shown in FIG. 7, a parallel circuit formed of a fuse F1 and a resistor element R1 is connected to one input terminal of a NOR circuit NOR. Another parallel circuit formed of a fuse F2 and a resistor element R2 is connected to the other input terminal of the NOR circuit NOR. These circuits generate signals substituting for external signals OS1 and OS2 in the column end address control circuit shown in FIG. 6.

One end of each of the fuses F1 and F2 is grounded. One end of each of the resistor elements R1 and R2 is connected to a power supply potential Vdd. The resistor elements R1 and R2 have a high resistance. So long as the fuse F1 and F2 are not cut, the resistor elements prevent the potential at the nodes respectively connected to the fuses F1 and F2 from increasing to the power supply potential Vdd. In other words, so long as the fuse F1 and F2 are not cut, the input terminals of the NOR circuit are kept at the ground potential.

Before the main memory cell array is expanded, neither of the fuses is cut. Where the main memory cell array is expanded by 4 columns, the fuse F1 is cut. This state is the same as a state where the external signal OS1 is inputted into the circuit shown in FIG. 6. Where the main memory cell array is expanded by 8 columns, the fuse F2 is cut. This state is the same as a state where the external signal OS2 is inputted into the circuit shown in FIG. 6. Accordingly, building the fuses therein, an expansion area of the main memory cell array can be set.

Figure 8:
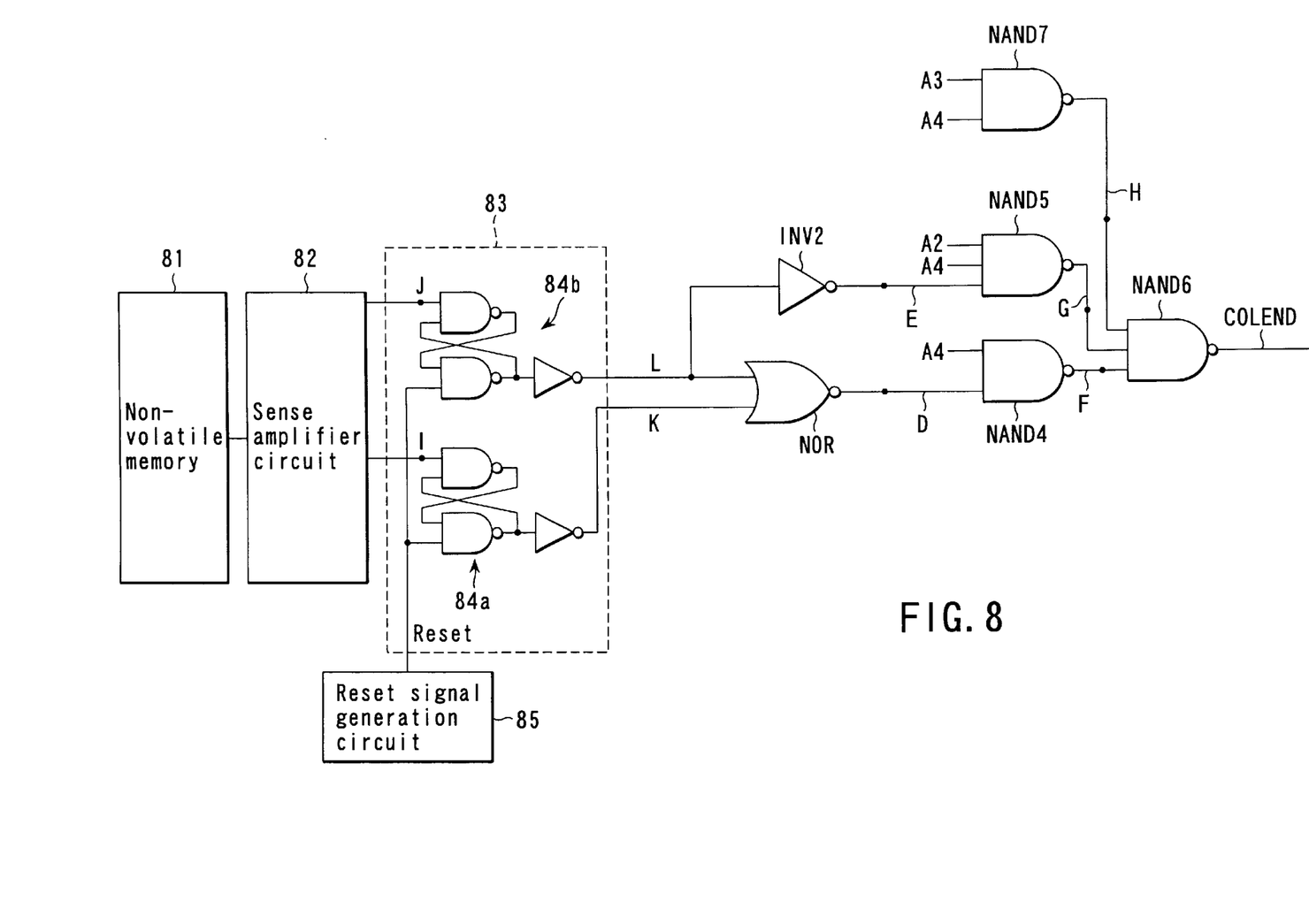
FIG. 8 is a circuit diagram showing a column end address control circuit in a semiconductor storage device according to a modification of the second embodiment of the present invention.

FIG. 8 is a circuit diagram showing a column end address control circuit in a semiconductor storage device according to a modification of the second embodiment of the present invention. The column end address control circuit shown in FIG. 8 is used as the column end address control circuit 15 shown in FIG. 1.

In the column end address control circuit shown in FIG. 8, a non-volatile memory 81 for storing data that determines a column end address is connected to the input terminals of a NOR circuit NOR through a sense amplifier circuit 82 and a data register 83. The data register 83 includes latch circuits 84a and 84b (each formed of a flip-flop and an inverter) connected to the input terminals of the NOR circuit NOR. The sense amplifier circuit 82 is connected to one of the input terminals of each of the latch circuits 84a and 84b, and a reset signal generation circuit 85 is connected to the other of the input terminals.

For example, the non-volatile memory 81 stores data of two bits. When reading this data, if the data is "0, 0", nodes I and J are set at L level and L level, respectively; if the data is "0, 1", the nodes I and J are set at L level and H level, respectively; and if the data is "1, 0", the nodes I and J are set at H level and L level, respectively. The data at the nodes I and J are latched at nodes K and L as they are, respectively.

A column end address is determined, e.g., by the following process. First, the RESET signal from the reset signal generation circuit 85 is set at L level to reset the data register 83. Next, the RESET signal from the reset signal generation circuit 85 is set at H level, and then the data in the non-volatile memory 81 is taken into the data register 83 through the sense amplifier circuit 82. By doing so, the potentials at the nodes K and L are settled, so that a column end address is determined. It may be designed that switching of the RESET signal from L level to H level is performed along with the boot-up of an information processing apparatus containing this semiconductor storage device.

According to this embodiment, the same effects as the first embodiment can be obtained.

(Third Embodiment)

This embodiment relates to a testing method of a semiconductor storage device as describe in the first or second embodiment, to detect defective memory cells by inputting an external signal to perform writing, reading, and erasing of data in all the memory cell arrays.

In order to detect defective memory cells with a tester to perform trimming, the entire redundancy memory cell array is temporally set to be an expansion area of the main memory cell array by inputting the external signal OS2. In this state, all the memory cell arrays are provided with main memory addresses.

Then, test-writing of data is performed on all the memory cell arrays, using a command for reading on the main memory cell array. Then, reading of data is performed by a tester on all the memory cell arrays, using a command for reading on the main memory cell array, so as to confirm whether the data has appropriately been written. Then, erasing of data is performed on all the memory cell arrays, using a command for erasing on the main memory cell array. Then, reading of data is performed on all the memory cell arrays, using a command for reading on the main memory cell array, so as to confirm whether the data has appropriately been erased.

The test-writing of data is performed to check whether defective memory cells are present. When reading is performed after data writing, and the written data is not read from a memory cell, it is confirmed that the memory cell is defective. In this process, writing, reading, and erasing of data can be performed on all the memory cell arrays together.

As described above, it is possible to perform detection of defective memory cells on all the memory cell arrays, without performing tests on the main memory cell array and the redundancy memory cell array independently of each other. Then, a fuse corresponding to a defective memory cell in the main memory cell array is cut, and a fuse corresponding to a replacing memory cell in the redundancy memory cell array is cut. At this time a plurality of fuses are cut so that one redundancy column is automatically selected when the address of a defective column is selected. The combination of the cut fuses designates the address of the defective column to be replaced. As a result, a replacing area for replacing defective memory cells of the main memory cell array is determined in the redundancy memory cell array. At this time, an area of the redundancy memory cell array to be used for an expansion area of the main memory cell array is set to be out of the replacing area.

According to this embodiment, there is provided a testing method of a semiconductor storage device, which basically comprises performing writing, reading, erasing, and reading of data on a main memory cell array 1 to detect a defective area; performing writing and reading of data, which is used for the main memory cell array 1, on a redundancy memory cell array 2 entirely, to confirm whether the data is appropriately written; and performing erasing and reading of the data written in the entire redundancy memory cell array 2, to confirm whether the data is appropriately erased. In the testing method of a device according to this embodiment, a test on the entire main memory cell array and a test on the entire redundancy memory cell array, which correspond to each other, may be performed together. As a result, the efficiency of the test process on a semiconductor storage device is improved.

The first to third embodiments may be applied not only to a non-volatile semiconductor storage device, but also to a memory, such as a MASKRO, which performs serial reading with gradually increased addresses. The first to third embodiments may be arbitrarily combined in practice.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device comprising:
    a main memory cell array including a plurality of memory cells;
    a redundancy memory cell array including a plurality of memory cells, which are usable to replace a defective memory cell in the main memory cell array, the redundancy memory cell array being set to selectively have a replacing area replacing a defective memory cell in the main memory cell array, and a non-replacing area other than the replacing area;
    a memory selection circuit configured to select and drive memory cells in the main memory cell array and the redundancy memory cell array;
    a control section configured to control the memory selection circuit, the control section being set to assign main memory addresses to memory cells in the non-replacing area, and use these memory cells as an expansion area of the main memory cell array.

2. A device according to claim 1, wherein the memory selection circuit comprises a main memory selection circuit configured to select memory cells in the main memory cell array, and a redundancy memory selection circuit configured to select memory cells in the redundancy memory cell array.

3. A device according to claim 1, wherein the control section comprises an end address control circuit configured to generate an end signal indicating that a selected specific address in the expansion area is an end address.

4. A device according to claim 3, wherein the expansion area is formed of memory cells having consecutive redundancy memory address numbers.

5. A device according to claim 4, wherein the expansion area is formed of memory cells having consecutive redundancy memory column address numbers.

6. A device according to claim 4, wherein the replacing area is formed of memory cells having consecutive redundancy memory address numbers.

7. A device according to claim 3, wherein the control section comprises an address signal generator configured to supply the memory selection circuit with an address signal to serially access memory cells in the main memory cell array and memory cells in the expansion area.

8. A device according to claim 7, wherein the address signal generator comprises an address increment circuit configured to generate an address signal having address numbers gradually increased from a main memory address, so as to access memory cells in the expansion area, in succession to memory cells in the main memory cell array.

9. A device according to claim 8, wherein the address increment circuit stops operating upon the end signal being present.

10. A device according to claim 3, wherein the end address control circuit includes a fuse to form the end signal based on cut and uncut states of the fuse.

11. A device according to claim 3, wherein the end address control circuit is configured to form the end signal based on an external input signal.

12. A device according to claim 3, wherein the end address control circuit comprises a non-volatile memory to form the end signal based on data stored in the non-volatile memory.

13. A device according to claim 1, wherein the memory selection circuit comprises a replacing circuit portion configured to replace a defective memory cell in the main memory cell array with a memory cell in the redundancy memory cell array, and the replacing area and the non-replacing area are selectively set by the replacing circuit portion.

14. A device according to claim 13, wherein the replacing circuit portion includes a fuse to set the replacing area based on cut and uncut states of the fuse.

15. A device according to claim 1, wherein the expansion area comprises an area that stores an error correction code.

16. A semiconductor storage device comprising:
a main memory cell array including a plurality of memory cells;
a redundancy memory cell array including a plurality of memory cells, which are usable to replace a defective memory cell in the main memory cell array;
a memory selection circuit configured to select and drive memory cells in the main memory cell array and the redundancy memory cell array, the memory selection circuit including a replacing circuit portion configured to replace a defective memory cell in the main memory cell array with a memory cell in the redundancy memory cell array, and the redundancy memory cell array being set by the replacing circuit portion to selectively have a replacing area replacing a defective memory cell in the main memory cell array, and a non-replacing area other than the replacing area;
an address increment circuit configured to supply the memory selection circuit with an address signal having address numbers gradually increased from a main memory address, so as to access memory cells in the non-replacing area, in succession to memory cells in the main memory cell array; and
an end address control circuit configured to generate an end signal indicating that a selected specific address in the non-replacing area is an end address, wherein the address increment circuit stops operating upon the end signal being present.

17. A device according to claim 16, wherein the end address control circuit includes a fuse to form the end signal based on cut and uncut states of the fuse.

18. A device according to claim 16, wherein the end address control circuit comprises a non-volatile memory to form the end signal based on data stored in the non-volatile memory.

19. A method of setting a semiconductor storage device, comprising:
setting a redundancy memory cell array to selectively have a replacing area replacing a defective memory cell in a main memory cell array, and a non-replacing area other than the replacing area; and
setting a control section to assign main memory addresses to memory cells in the non-replacing area, and use these memory cells as an expansion area of the main memory cell array, wherein the control section controls the memory selection circuit configured to select and drive memory cells in the main memory cell array and the redundancy memory cell array.

20. A device according to claim 19, wherein the expansion area comprising an area that stores an error correction code.

21. A device according to claim 19, further comprising, prior to setting the replacing area, the non-replacing area, and the expansion area,
performing writing, reading, erasing, and reading of data on the main memory cell array to detect a defective area;
performing writing and reading of data, which is used for the main memory cell array, on the redundancy memory cell array entirely, to confirm whether the data is appropriately written; and
performing erasing and reading of the data written in the entire redundancy memory cell array, to confirm whether the data is appropriately erased.

22. A device according to claim 21, further comprising setting the entire redundancy memory cell array to be the expansion area of the main memory cell array, with main memory addresses assigned thereto, so as to perform the writing, reading, erasing, and reading of data on the main memory cell array and the redundancy memory cell array together, using a command for the main memory cell array.

* * * * *